United States Patent
Roy et al.

(10) Patent No.: US 9,767,870 B1
(45) Date of Patent: Sep. 19, 2017

(54) VOLTAGE AWARE CIRCUITRY

(71) Applicant: ARM Limited, Cambridge (GB)

(72) Inventors: Rajiv Kumar Roy, Bangalore (IN); Kanika Malik, Bengaluru (IN); Manoj Puthan Purayil, Bangalore (IN); Vikash, Bangalore (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/238,551

(22) Filed: Aug. 16, 2016

(51) Int. Cl.
G11C 5/14 (2006.01)
G11C 7/10 (2006.01)
G11C 7/06 (2006.01)
G11C 8/10 (2006.01)

(52) U.S. Cl.
CPC .............. *G11C 7/1096* (2013.01); *G11C 5/14* (2013.01); *G11C 7/06* (2013.01); *G11C 8/10* (2013.01)

(58) Field of Classification Search
USPC ............................ 365/226, 207, 194, 189.16
See application file for complete search history.

(56) References Cited

U.S. PATENT DOCUMENTS

| | | | | |
|---|---|---|---|---|
| 5,343,086 A * | 8/1994 | Fung | ....................... | G05F 1/565 327/530 |
| 5,534,801 A * | 7/1996 | Wu | ..................... | G06F 13/4072 326/81 |
| 6,124,732 A * | 9/2000 | Zilic | ................ | H03K 19/01858 326/63 |
| 6,633,171 B2 * | 10/2003 | Brown | ...................... | G06F 1/28 324/522 |
| 2010/0290295 A1 * | 11/2010 | Moriwaki | ................ | G11C 7/14 365/191 |

* cited by examiner

*Primary Examiner* — Vu Le
(74) *Attorney, Agent, or Firm* — Pramudji Law Group PLLC; Ari Pramudji (57) ABSTRACT

Various implementations described herein are directed to an integrated circuit. The integrated circuit may include core circuitry having an array of memory cells and a row decoder that accesses each of the memory cells via a selected wordline and a wordline signal. The core circuitry may operate at a first supply voltage. The integrated circuit may include periphery circuitry having a column decoder that accesses each of the memory cells via a selected bitline. The periphery circuitry may operate at a second supply voltage that is different than the first supply voltage. The periphery circuitry may include voltage differential sensing circuitry that may compare the first supply voltage to the second supply voltage, sense a voltage differential between the first and second supply voltages, and delay the wordline signal when the voltage differential is greater than a threshold voltage.

14 Claims, 9 Drawing Sheets

VOLTAGE AWARE CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

At high core voltages, there can be write failures due to false read when a timing mismatch takes place between row select and column select lines especially at skewed corners where VDDC>>VDDP. During a write to an opposite state, a write transistor in a local bit selector can pull down on a local bit line, while a memory cell pulls down on an opposite local bit line. This can result in both local bit lines being pulled down to ground, thereby likely inhibiting the memory cell from writing, resulting in write failure.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to voltage aware circuitry for write for memory applications. For instance, some implementations may refer to voltage aware design for dual rail memory architectures. The voltage aware circuitry and techniques described herein may reduce, inhibit, and/or likely eliminate instances of false read (or write failure) by delaying arrival of a wordline signal in write cycles at higher core voltages, where the write itself may be faster. The voltage aware circuitry and techniques described herein may further unveil concepts for sensing a voltage difference or voltage differential between a core supply voltage VDDC and a periphery supply voltage VDDP and correspondingly delaying arrival of the wordline in write cycles, if VDDC>>VDDP by, e.g., 100 mV or more. In many cases, the delay in wordline arrival may be applied only for write cycles and not the read cycles such that access time is not penalized.

Various implementations of random access memory will be described in greater detail herein with reference to FIGS. 1-5.

Figure 1:
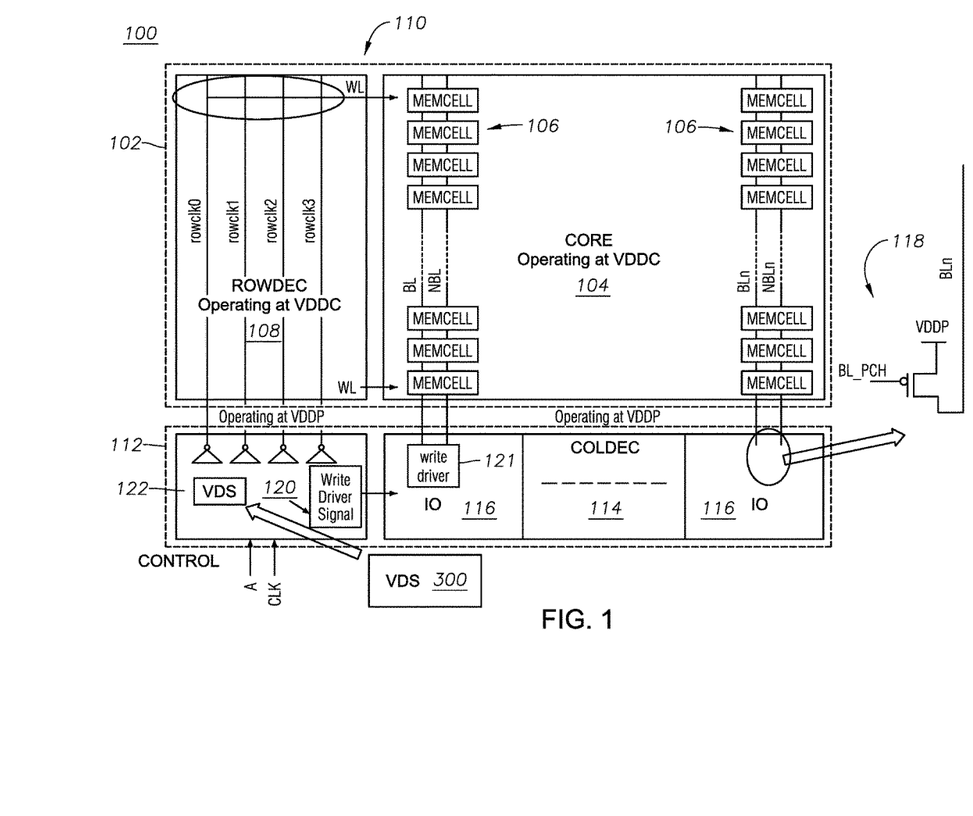
FIG. 1 illustrates a diagram of memory circuitry in accordance with various implementations described herein.

FIG. 1 illustrates a block diagram of memory circuitry 100 in accordance with various implementations described herein.

The memory circuitry 100 may be implemented as an integrated circuit (IC) in utilizing various types of memory, such as, e.g., random access memory (RAM), and/or any other types of memory, including any type of volatile and non-volatile memory. In some implementations, the memory circuitry 100 may be implemented as an IC with dual rail memory architecture. In other implementations, the memory circuitry 100 may be integrated with computing circuitry and various related components on a single chip. Further, the memory circuitry 100 may be implemented in an embedded system for various electronic and mobile applications.

As shown in FIG. 1, the memory circuitry 100 may include core circuitry 102 having a core 104 with an array of memory cells 106 arranged in rows and columns. The memory circuitry 102 may include a row decoder 108 (ROWDEC) that accesses each of the memory cells 106 via a selected wordline (WL) 110. In some cases, the memory circuitry 100 including the core 104, the memory cells 106, and the row decoder 108 may operate at a first supply voltage, such as, e.g., a core supply voltage VDDC. The voltage range varies with technology. In some cases, the row decoder 108 may operate at the core supply voltage VDDC, and other components, such as, e.g., the write driver signal generator 120 may generate a write (WR) driver signal at a second supply voltage that is different than the first or core supply voltage VDDC, such as, e.g., a periphery supply voltage VDDP.

As shown in FIG. 1, the core 104 may include the array of memory cells 106, and each memory cell 106 may be referred to as a bitcell. Further, each memory cell 106 may be configured to store at least one data bit value (e.g., a data value associated with logical '0' or '1'). In various implementations, the array of memory cells 106 may include any number of memory cells or bitcells arranged in various configurations, such as, e.g., a two-dimensional (2D) memory array having columns and rows of multiple memory cells arranged in a 2D grid pattern with 2D indexing capabilities.

In some cases, each memory cell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

The memory circuitry 100 may include periphery circuitry 112 having a column decoder 114 (COLDEC) with input/output (I/O) circuitry 116 that accesses each of the memory cells 106 via a selected bitline BL, ..., BLn. The selected bitline BL, ..., BLn may include a selected pair of complementary bitlines BL/NBL, ..., BLn/NBLn. Further, the periphery circuitry 112 may include the write driver signal generator 120 coupled to the row decoder 108 and the column decoder 114 to select a memory cell 106 in the array of memory cells 106 with a wordline signal and a bitline signal. The periphery circuitry 112 may operate at the second or periphery supply voltage VDDP, that is different than the first or core supply voltage VDDC. The voltage range varies with technology. In some cases, the column decoder 114 may operate at the periphery supply voltage VDDP, and the write driver signal generator 120 may generate the bitline pulldown signal at the periphery supply voltage VDDP.

As shown in FIG. 1, the write driver signal generator 120 may receive one or more control signals, such as, e.g., address signals (A) and clock signals (CLK) and WEN (Write Enable) via rowclk generation circuitry 122. Further, in some cases, the I/O circuitry 116 may include bitline precharge circuitry 118 that may be used to precharge the bitlines BL/NBL, . . . , BLn/NBLn.

The periphery circuitry 112 may include the rowclk generation circuitry 122 and a write driver 121. During a write cycle, the write driver 121 may write data to the selected memory cell 106 via the selected wordline (WL) 110 and the selected bitline (BLn/NBLn). Further, during a write cycle, the rowclk generation circuitry 122 may include voltage differential sensing (VDS) circuitry 300 that may compare the core supply voltage VDDC to the periphery supply voltage VDDP, sense a voltage differential ΔV between the core and periphery supply voltages VDDC, VDDP, and delay the wordline signal when the voltage differential ΔV is greater than a threshold voltage Vth. In various cases, the threshold voltage Vth may be 100 mV. In various other cases, the threshold voltage Vth may be any voltage above zero volts (0V).

In some implementations, the VDS circuitry 300 may delay the wordline signal only during the write cycle. In some other implementations, the VDS circuitry 300 may delay the wordline signal only when the voltage differential ΔV is greater than the threshold voltage Vth.

As shown in FIG. 1, the rowclk generation circuitry 122 includes the voltage differential sensing (VDS) circuitry 300 having various components, such as, e.g., a sense amplifier and one or more capacitors, that add capacitances to introduce imbalance based on the core and periphery supply voltages VDDC, VDDP. Therefore, in some cases, the VDS circuitry 300 is coupled to the rowclk generation circuitry 122 and/or the row decoder 108. In some implementations, as further described in greater detail herein, ratios of the capacitances may determine a value of the voltage threshold Vth that causes the VDS circuitry 300 to delay the wordline signal when the voltage differential ΔV is greater than the threshold voltage Vth.

Figure 2:
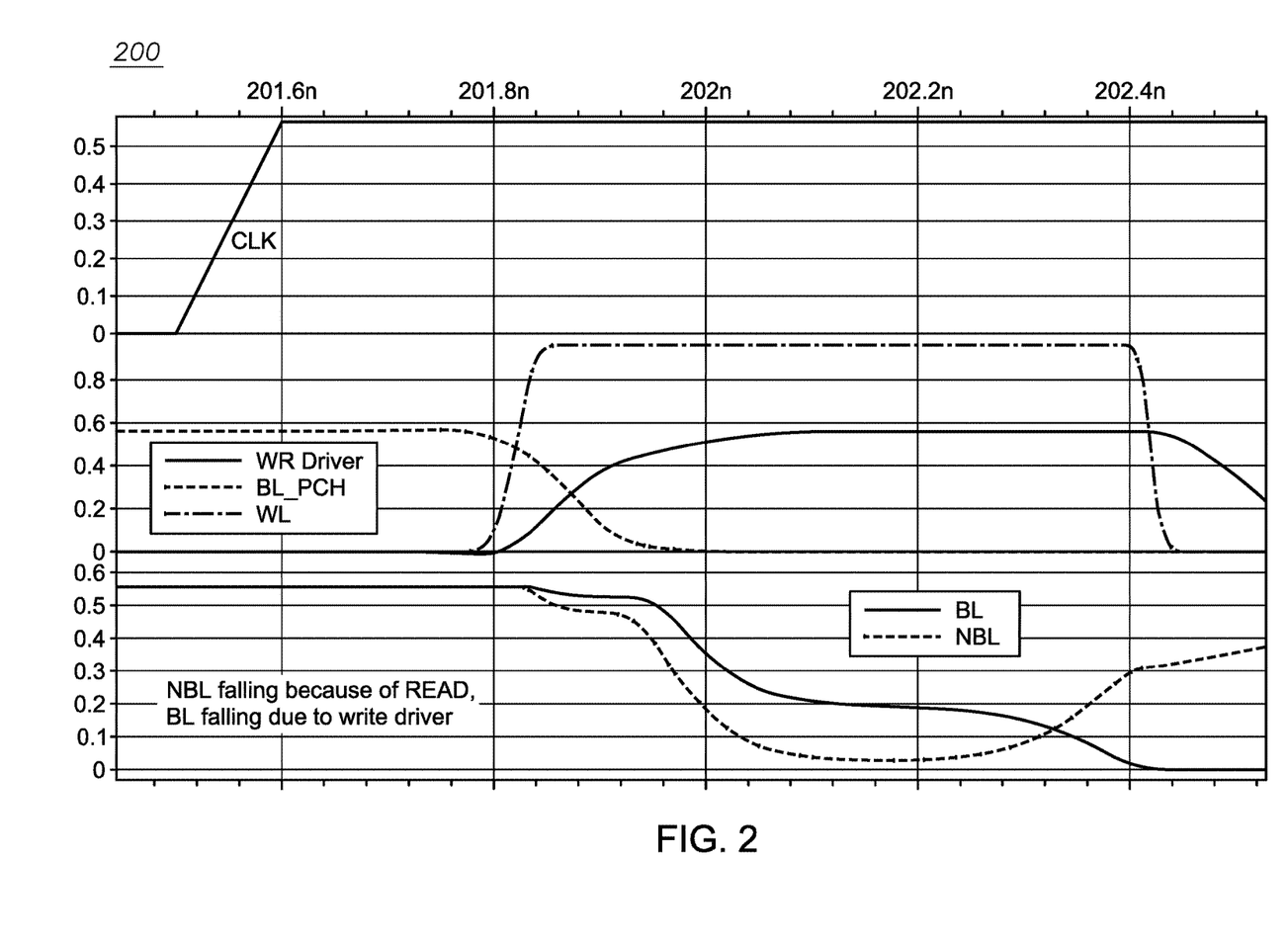
FIG. 2 illustrates a diagram of a false read or write failure in accordance with various implementations described herein.

FIG. 2 illustrates a diagram 200 of a write failure in accordance with various implementations described herein.

In some memory designs, such as, e.g., static random access memory (SRAM) designs, the row decoder 108 may be kept at the core supply voltage VDDC such that the wordline WL may be generated at the core voltage VDDC, and the other periphery logic may be kept at the periphery supply voltage VDDP. In some implementations, the design may be improved or optimized for VDDC=VDDP with margins related to the write driver clock to arriving before wordline signal arrival.

In some cases, with VDDC>>VDDP, during a write to the opposite state, if the wordline becomes active before the write signal arrives at the local bit select, the memory cell is in read mode before the write can occur, resulting in a situation where one local bit line is pulled down to ground due to the read while the other is pulled down on arrival of write signal leaving the cell in an un-writeable state. This phenomenon is referred to as a false read. Further, the memory cell may erroneously start reading the data, and in a worse case, the memory cell may cause a glitch at the output and may result in corrupting output boundary latches. The phenomenon may occur for some cases where the device and metal capacitance is on a low side, and a pass gate threshold voltage Vt is low. Even at lower voltage skews, the low capacitance bitline may be pulled low before the write driver 121 is turned on thus possibly leading to write failures as shown in FIG. 2.

FIG. 2 shows a rising edge of a clock signal CLK. Based on the clock signal CLK, the bitline precharge signal BL_PCH, the wordline signal WL, and the write driver signal WR Driver are implemented as shown in FIG. 2. Based on these signals, the complimentary bitline NBL may be falling because of a read operation, and the bitline BL may be falling due to the write driver signal WR Driver. In this instance, false read and/or write failure may occur when VDDC>>VDDP. As such, various implementations described herein may be used to tackle false read and/or write failure, when margins are targeted with a level shift of a differential voltage ΔV (VDDC=VDDP+ΔV).

Thus, various implementations described herein refer to and are directed to a technique that reduces, inhibits, and/or eliminates occurrence of read before write (false read and/or write failure) by sensing a voltage differential ΔV between the core supply voltage VDDC and the periphery supply voltage VDDP and delaying arrival of the wordline signal WL, if VDDC>>VDDP (i.e., VDDC=VDDP+ΔV). In some cases, the delay in the arrival of the wordline signal WL may be applied only for write cycles and not read cycles such that access time is not penalized. In some other cases, the delay may be applied only in arrival time of the wordline signal WL without changing wordline fall time, such that the write cycle time remains unchanged. Further, a reduced pulse-width for a write cycle may not pose an issue as the write is much faster at higher core voltages.

Figure 3A:
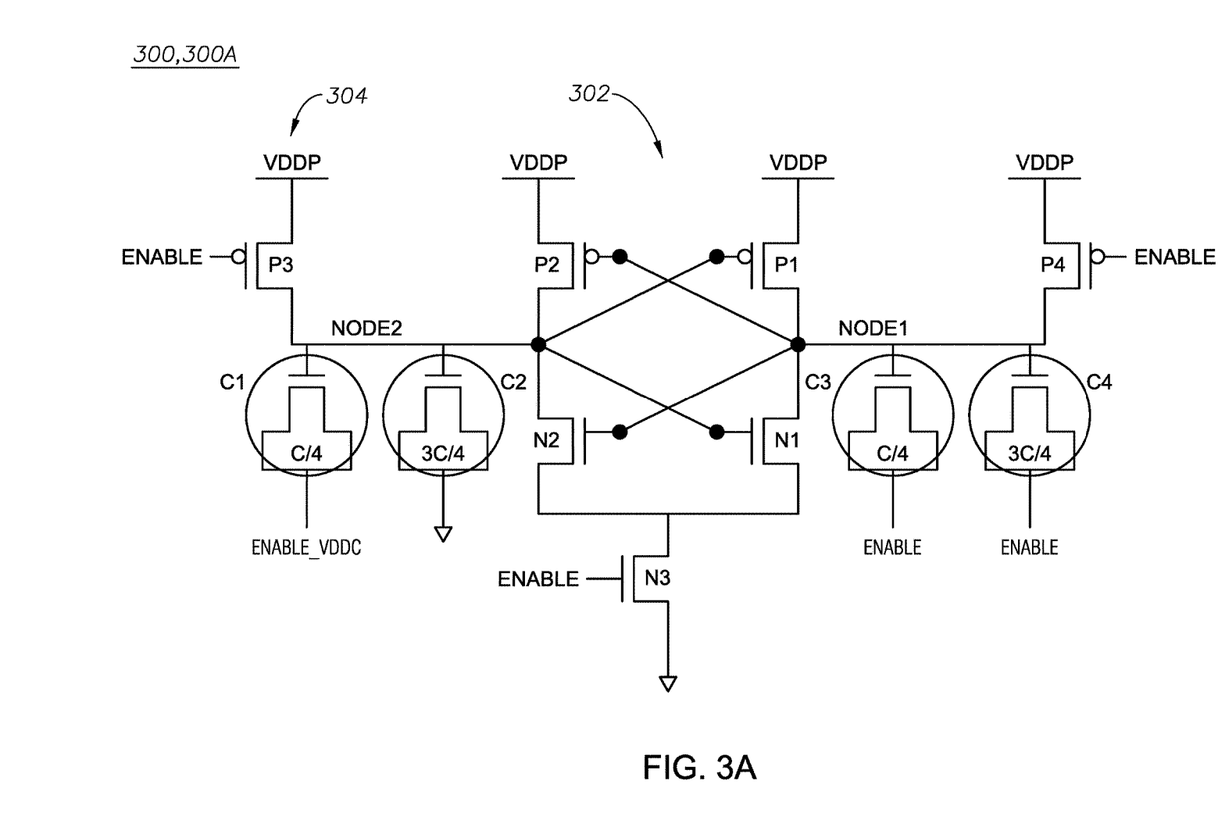
FIGS. 3A-3C illustrate diagrams of voltage differential sensing circuitry in accordance with various implementations described herein.
Figure 3B:
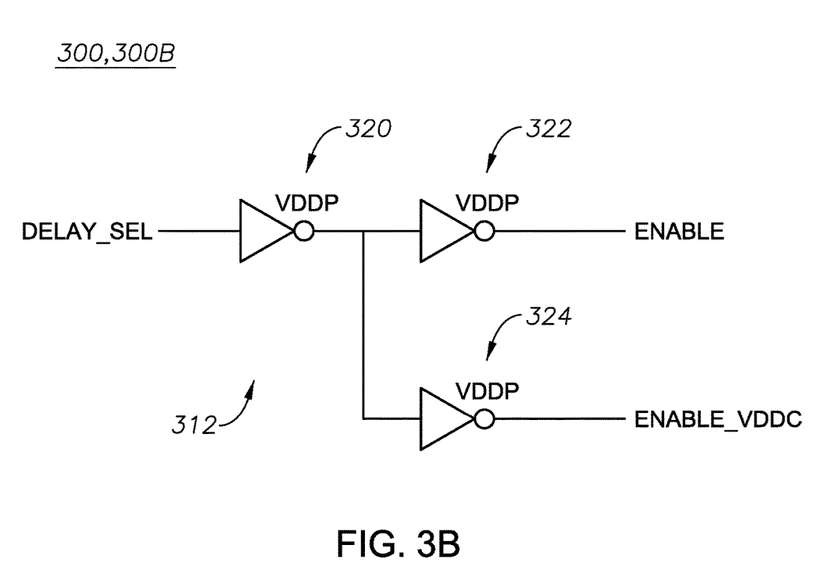
Figure 3C:
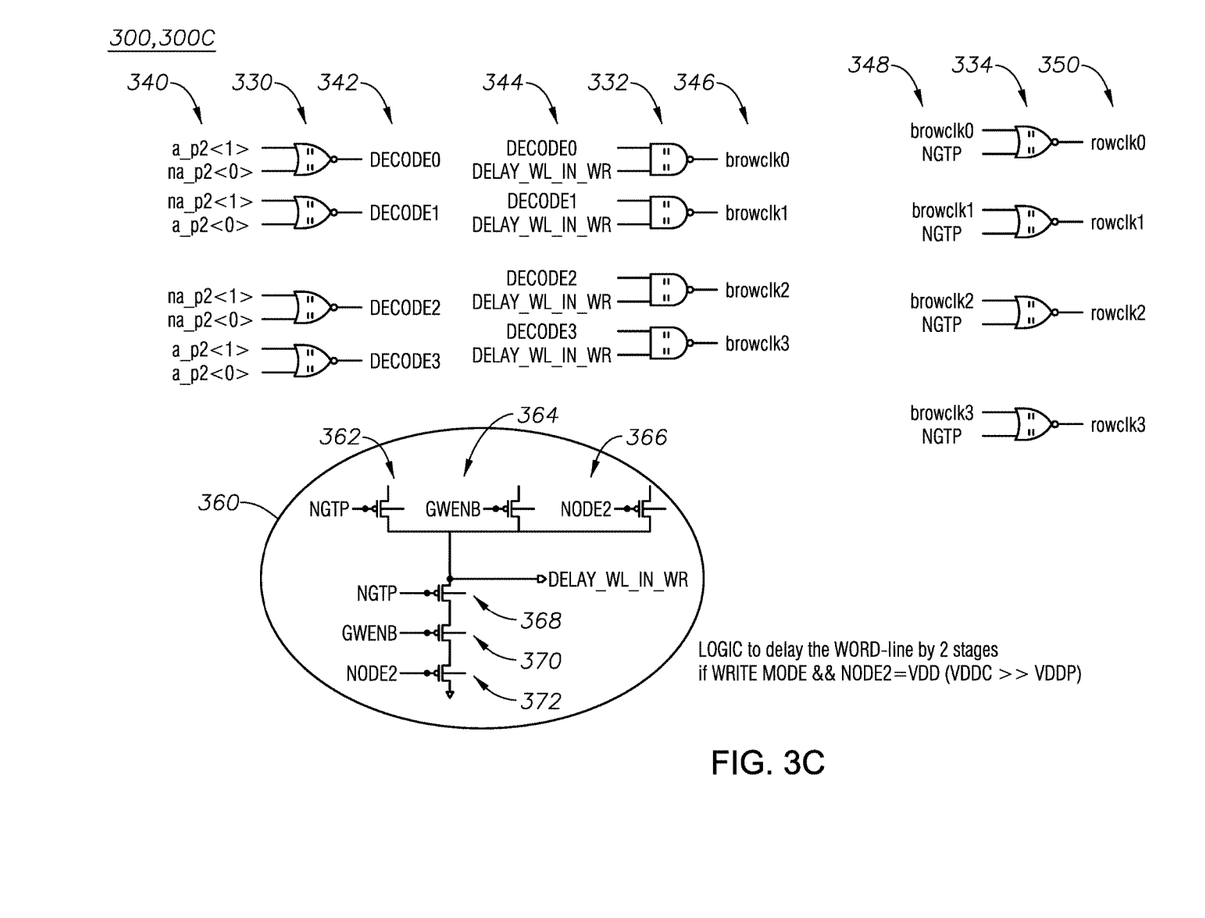

FIGS. 3A-3C illustrate various diagrams of voltage differential sensing (VDS) circuitry 300 in accordance with various implementations described herein. In particular, FIG. 3A illustrates a diagram of a first circuit 300A of the VDS circuitry 300, FIG. 3B illustrates a diagram of a second circuit 300B of the VDS circuitry 300, and FIG. 3C illustrates a diagram of a third circuit 300C of the VDS circuitry 300.

As described in reference to FIG. 1, the memory circuitry 100 may include the array of memory cells 106 and the rowclk generation circuitry 122 that generates a wordline signal WL to select a memory cell 106 in the array of memory cells 106 during a write cycle. Further, the rowclk generation circuitry 122 may include the voltage differential sensing (VDS) circuitry 300 that compares the core supply voltage VDDC to the periphery supply voltage VDDP, senses the voltage differential ΔV between the core and periphery supply voltages, such as, e.g., VDDC=VDDP+ΔV, and delays the wordline signal WL when the voltage differential ΔV is greater than a threshold voltage, such as e.g., 100 mV. For instance, in some cases, ΔV may be greater than the threshold voltage.

In reference to FIG. 3A, the VDS circuitry 300 may include a sense amplifier 302 having a plurality of transistors, including p-type metal-oxide-semiconductor (PMOS) transistors and n-type MOS (NMOS) transistors. In some implementations, the sense amplifier 302 may be a balanced sense amplifier. Further, as shown, the sense amplifier 302 may include a first pair of complementary transistors P1, N1, a second pair of complementary transistors P2, N2, a first node NODE1, and a second node NODE2 that is different than the first node NODE1. As shown in FIG. 3A, the first node NODE1 may be interposed between the first pair of complementary transistors P1, N1, and the first node NODE1 may be coupled to each gate of the second pair of complementary transistors P2, N2. The second node NODE2 may be interposed between the second pair of complementary transistors P2, N2, and the second node NODE2 may be coupled to each gate of the first pair of complementary transistors P1, N1.

The VDS circuitry 300 may include a first capacitor C1 coupled to the second node NODE2, and the first capacitor C1 may couple charge on the second node NODE2 when a enable signal ENABLE_VDDC rises from a logic zero state to a logic one state. In some implementations, the first capacitor C1 may receive the enable signal ENABLE_VDDC operating at core voltage VDDC, and the first capacitor C1 may include a first transistor (e.g., an NMOS transistor) that is coupled together to provide a first capacitance in a 1:4 ratio (e.g., C/4) when the first transistor receives the enable signal ENABLE_VDDC operating at core voltage VDDC.

The VDS circuitry 300 may include a second capacitor C2 coupled to the second node NODE2 in parallel with the first capacitor C1. In some implementations, the second capacitor C2 may be coupled to ground supply voltage and may thus receive a ground voltage signal (GND, VSS, etc.). Further, the second capacitor C2 may include a second transistor (e.g., an NMOS transistor) that is coupled together to provide a second capacitance in a 3:4 ratio (e.g., 3C/4) when the second transistor C2 receives the ground voltage signal (GND, VSS, etc.).

The VDS circuitry 300 may include a pair of third and fourth capacitors C3, C4 coupled to the first node NODE1, and the pair of capacitors C3, C4 couples charge on the first node NODE1 when a enable signal ENABLE rises from a logic zero state to a logic one state. In some implementations, the pair of capacitors C3, C4 may include the third capacitor C3 and the fourth capacitor C4 coupled in parallel to the first node NODE1. In some cases, the third capacitor C3 may receive the enable signal ENABLE operating at periphery voltage VDDP, and the third capacitor C3 may include a third transistor (e.g., an NMOS transistor) that is coupled together to provide a third capacitance in a 1:4 ratio (e.g., C/4) when the third transistor receives the periphery voltage signal VDDP. Further, in some other cases, the fourth capacitor C4 may receive the periphery voltage signal VDDP, and the fourth capacitor C4 may include a fourth transistor (e.g., an NMOS transistor) that is coupled together to provide a fourth capacitance in a 3:4 ratio (e.g., 3C/4) when the fourth transistor C4 receives the enable signal ENABLE operating at periphery voltage VDDP.

As described herein, the VDS circuitry 300 operates at the periphery supply voltage VDDP, and as such, the VDS circuitry 300 may include a voltage source bus 304 coupled to the periphery supply voltage VDDP. In some cases, sense amplifier 302 may be coupled to the voltage source bus 304, such that the sense amplifier 302 is interposed between the periphery supply voltage VDDP and a third NMOS transistor N3, which is coupled to ground (GND, VSS, etc.) and receives periphery enable signal ENABLE at its gate. Further, a third PMOS transistor P3 may be coupled between the voltage source bus 304 and the second node NODE2, and the third PMOS transistor P3 may receive the periphery enable signal ENABLE at its gate. Further, a fourth PMOS transistor P4 may be coupled between the voltage source bus 304 and the first node NODE1, and the fourth PMOS transistor P4 may receive the periphery enable signal ENABLE at its gate.

In reference to FIG. 3B, the VDS circuitry 300 may include an enable circuit 312 that receives a delay select signal DELAY_SEL and provides the core enable signal ENABLE_VDDC to the first capacitor C1 and the periphery enable signal ENABLE to each of the pair of capacitors C3, C4. In some cases, the core enable signal ENABLE_VDDC is based on the core supply voltage VDDC, and the periphery enable signal ENABLE is based on a periphery supply voltage VDDP.

In some implementations, the enable circuit 312 may include multiple buffers or inverters 320, 322, 324 that may be biased differently, e.g., with the core supply voltage VDDC (at the VDDC domain) or with the periphery supply voltage VDDP (at the VDDP domain). For instance, first and second buffers 320, 322 may be biased with the periphery supply voltage VDDP, and a third buffer 324 may be biased with the core supply voltage VDDC. In some implementations, as shown in FIG. 3B, the first and second buffers 320, 322 may be coupled in series. For instance, the first buffer 320 may receive the delay select signal DELAY_SEL and then provide an inverted delay select signal of DELAY_SEL to the second buffer 322. Further, the second buffer 322 provide the periphery enable signal ENABLE as an output signal. As further shown in FIG. 3B, the third buffer 324 may coupled between the first and second buffers 320, 322. In this instance, the third buffer 324 provide the core enable signal ENABLE_VDDC as another output signal.

When a voltage differential ΔV between the periphery supply voltage VDDP and the core supply voltage VDDC is greater than a voltage threshold Vth, then the pair of capacitors C3, C4 will couple less voltage on NODE1, and the first capacitor C1 will couple more voltage on the second node NODE2. The VDS circuit (300) will resolve the differential on NODE 1 and NODE2 in such a manner so as the NODE1 will be pulled down to logic zero and NODE 2 will remain at logic one. In this instance, rowclk generation circuitry 122 senses the logic zero state of the NODE1, senses the logic one state of the NODE2, and delays the wordline signal WL when the voltage differential ΔV is greater than the threshold voltage Vth. In some cases, as described herein, the threshold voltage Vth may be 100 mV.

As shown in FIG. 3A, the voltage differential sensing (VDS) circuitry 300 may include the sense amplifier 302 (e.g., a balanced sense amplifier) with capacitors C1, C2, C3, C4 providing additional capacitances to the first and second nodes NODE1, NODE2, respectively. In some cases, the capacitances may be added or provided to introduce imbalance based on core and periphery supply voltages VDDC, VDDP. As shown and described herein, the first capacitor C1 couples charge on the second node NODE2 when the core enable signal ENABLE_VDDC (at VDDC domain) goes HIGH (e.g., rises from logic zero to logic one), while the third and fourth capacitors C3, C4 couple charge on the first node NODE1 when the periphery enable signal ENABLE (at VDDP domain) goes HIGH (e.g., rises from logic zero to logic one). In some implementations, the ratios of C1-C2-C3-C4 may decide or determine a voltage differential ΔV or voltage threshold Vth for what amount or value of VDDC>VDDP should the delay be introduced. Further, in some implementations, the VDS circuitry 300 shown in FIG. 3A may operate only at power ramp-up and may remain idle throughout memory operation.

FIGS. 3A-3B illustrate the first and second circuits 300A, 300B of the VDS circuitry 300, and FIG. 3C illustrates the third circuit 300C of the VDS circuitry 300 associated with introduction of delay in row-decoder clock generation, in some cases, only if the VDDC>>VDDP, and if this situation occurs during a write cycle. For instance, as described in reference to FIGS. 3A-3B, operation of circuits 300A, 300B may be as follows. When a memory cell 106 is selected for operation, the VDS circuitry 300 pulls either of the first node NODE1 or the second node NODE2 low based on charge introduced on the nodes NODE1, NODE2 from the capacitances of the coupling capacitors C1-C2-C3-C4. Since the first node NODE1 has a total of C capacitance (i.e., C/4+3C/4=4C/4=C) connected thereto, while the second node NODE2 has C/4 capacitance connected thereto.

In some cases, this may occur, if VDDC=VDDP or if VDDC<VDDP+Vth (e.g., Vth=100 mV or less), and the second node NODE2 may be pulled low, and if this occurs, then no delay may be introduced in wordline generation. However, in some other cases, if VDDC>>VDDP (e.g., if VDDC>=VDDP+Vth, where Vth is greater than 100 mV), then the first node NODE1 may be pulled low, while the second node NODE2 may remain HIGH. In this case, based on whether the current operational mode is WRITE or READ, the delay in wordline generation may be be either introduced or not. As such, in this case, during a WRITE cycle, delay may be introduced in wordline generation, and during a READ delay may not be introduced in wordline generation.

In some implementations, the CONTROL block 112 of FIG. 1 may include a rowclk generation circuitry 122, which may be implemented with, e.g., the third circuit 300C of FIG. 3C. As shown in reference to FIG. 3C, the circuit 300C may include multiple logic circuits, such as, e.g., a first plurality of NOR gates 330, a plurality of NAND gates 332, and a second plurality of NOR gates 334, arranged to introduce delay when VDDC>>VDDP. The first plurality of NOR gates 330 may be arranged to receive complementary address signals 340 and provide decode signals 342. For instance, first complementary address signals (a_p2<1>, na_p2<0>) may be input to first NOR gate that may provide first decode signal DECODE0, second complementary address signals (na_p2<1>, a_p2<0>) may be input to second NOR gate that may provide second decode signal DECODE1, third complementary address signals (na_p2<1>, na_p2<0>) may be input to third NOR gate that may provide third decode signal DECODE2, and fourth complementary address signals (a_p2<1>, a_p2<0>) may be input to fourth NOR gate that may provide fourth decode signal DECODE3.

Further, the plurality of NAND gates 332 may be arranged to receive decode and delay signals 344 and provide brow signals 346. For instance, first decode and delay signals (DECODE0, DELAY_WL_IN_WR) may be input to first NAND gate that may provide first brow signal browclk0, second decode and delay signals (DECODE1, DELAY_WL_IN_WR) may be input to second NAND gate that may provide second brow signal browclk1, third decode and delay signals (DECODE2, DELAY_WL_IN_WR) may be input to third NAND gate that may provide third brow signal browclk2, and fourth decode and delay signals (DECODE3, DELAY_WL_IN_WR) may be input to fourth NAND gate that may provide fourth brow signal browclk3.

Further, the second plurality of NOR gates 334 may be arranged to receive brow and internal clock signals 348 and provide row clock signals 350. For instance, first brow signal and internal clock signals (browclk0, NGTP) may be input to first NOR gate that may provide first row clock signal rowclk0, second brow signal and internal clock signals (browclk1, NGTP) may be input to second NOR gate that may provide second row clock signal rowclk1, third brow signal—and internal clock signals (browclk2, NGTP) may be input to third NOR gate that may provide third rowclk2, and fourth brow signal and internal clock signals (browclk3, NGTP) may be input to fourth NOR gate that may provide fourth row clock signal rowclk3.

In some implementations, the third circuit 300C of FIG. 3C may include a logic circuit 360 to delay the wordline WL, e.g., by two stages in write mode when the second node NODE2=VDD (i.e., when VDDC>>VDDP). As shown in reference to FIG. 3C, the logic circuit 360 may include multiple PMOS transistors 362, 364, 366 coupled in parallel. For instance, a first PMOS transistor 362 receives the internal clock signal NGTP at its gate, a second PMOS transistor 364 receives a global write enable signal GWENB at its gate, and a third PMOS transistor 366 receives the second node signal NODE2 at its gate. Further, as shown in FIG. 3C, the logic circuit 360 may include multiple NMOS transistors 368, 370, 372 coupled in series between the PMOS transistors 362, 364, 366 and ground (e.g., GND, VSS, etc.). In this instance, a first NMOS transistor 368 receives the internal clock signal NGTP at its gate, a second NMOS transistor 370 receives the global write enable signal GWENB at its gate, and a third NMOS transistor 372 receives the second node signal NODE2 at its gate.

In some implementations, during operation, the row-decoder clock generation circuit 300C generates the row-clk<0:3> with decoded address browclk being mixed with NGTP (i.e., internal clock with active low) in normal mode. To introduce delay in wordline generation when VDDC>>VDDP during write mode, the internal clock signal NGTP may be mixed with the global write enable signal GWENB to generate the clocked delay signal DELAY_WL_IN_WR. In read mode, GWENB=0, DELAY_WL_IN_WR is HIGH, and the decoded address reaches browclk. When NGTP goes low, the rowclk <0:3> is generated based on the address. In write mode, if VDDC<~VDDP, then GWENB=1, NODE2=0, DELAY_WL_IN_WR is HIGH, and the decoded address reaches browclk. When NGTP goes low, the rowclk <0:3> may be generated based on the address. Further, in write mode, if VDDC>>VDDP, then GWENB=VDD, NODE2=VDD, and DELAY_WL_IN_WR goes HIGH only when NGTP goes LOW. In some implementations, it may be only after NGTP goes LOW that the decoded address reaches browclk and then may generate the delayed rowclk signal (i.e., delay of 2 stages). In some cases, the reset of the wordline may not be delayed and may occur when NGTP goes HIGH.

Figure 4A:
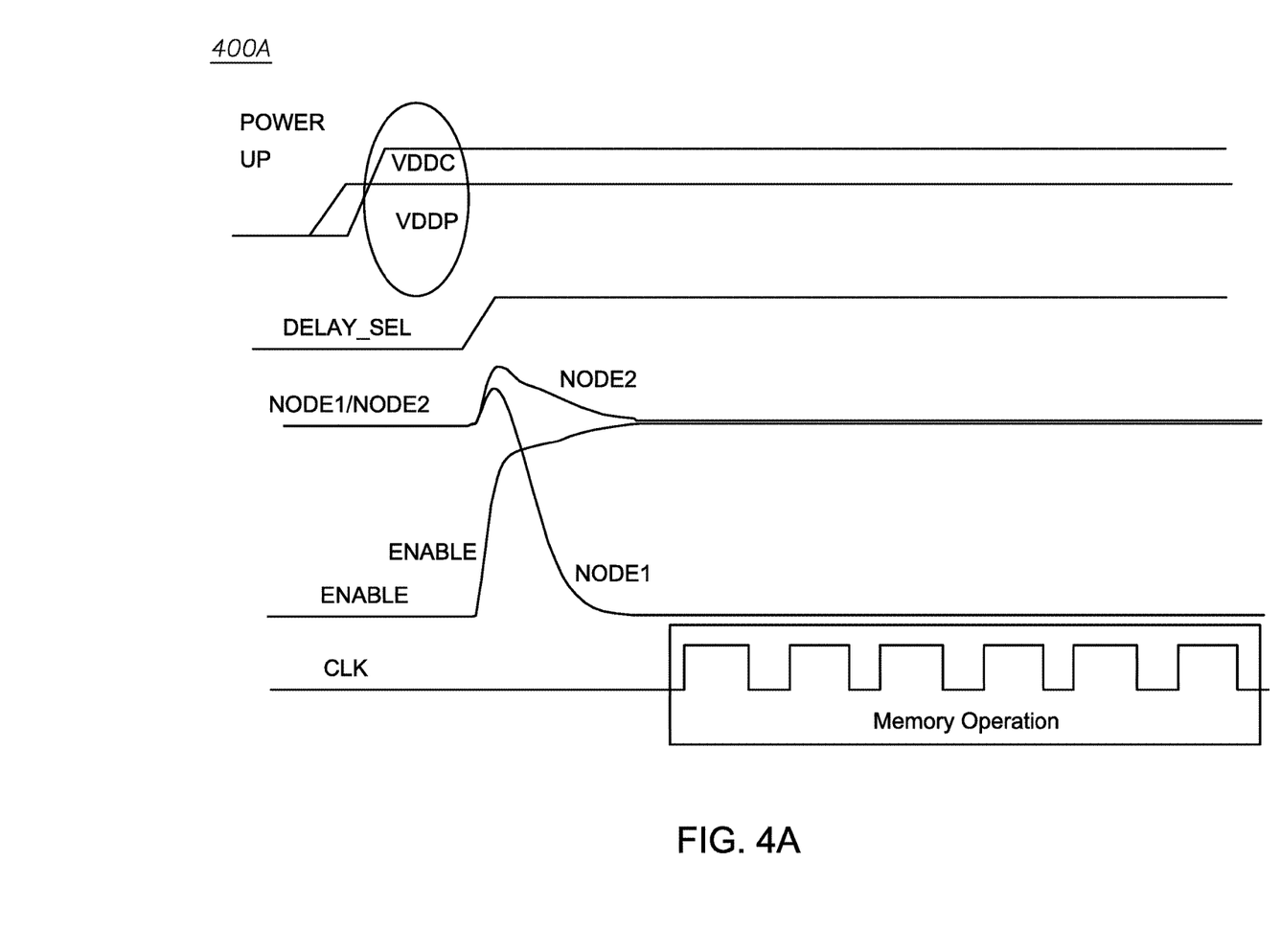
FIGS. 4A-4C illustrate various signal timing diagrams in accordance with various implementations described herein.
Figure 4B:
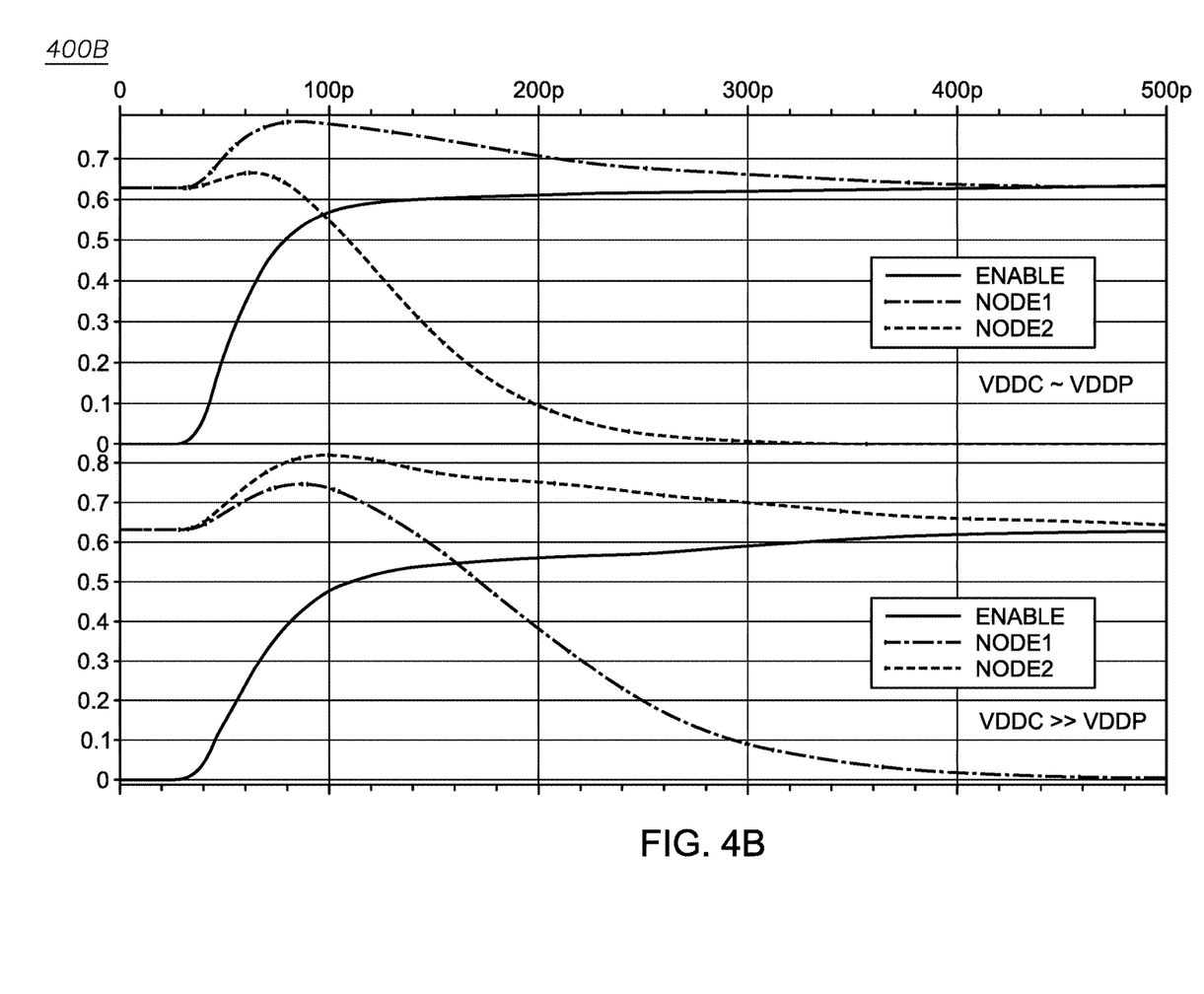
Figure 4C:
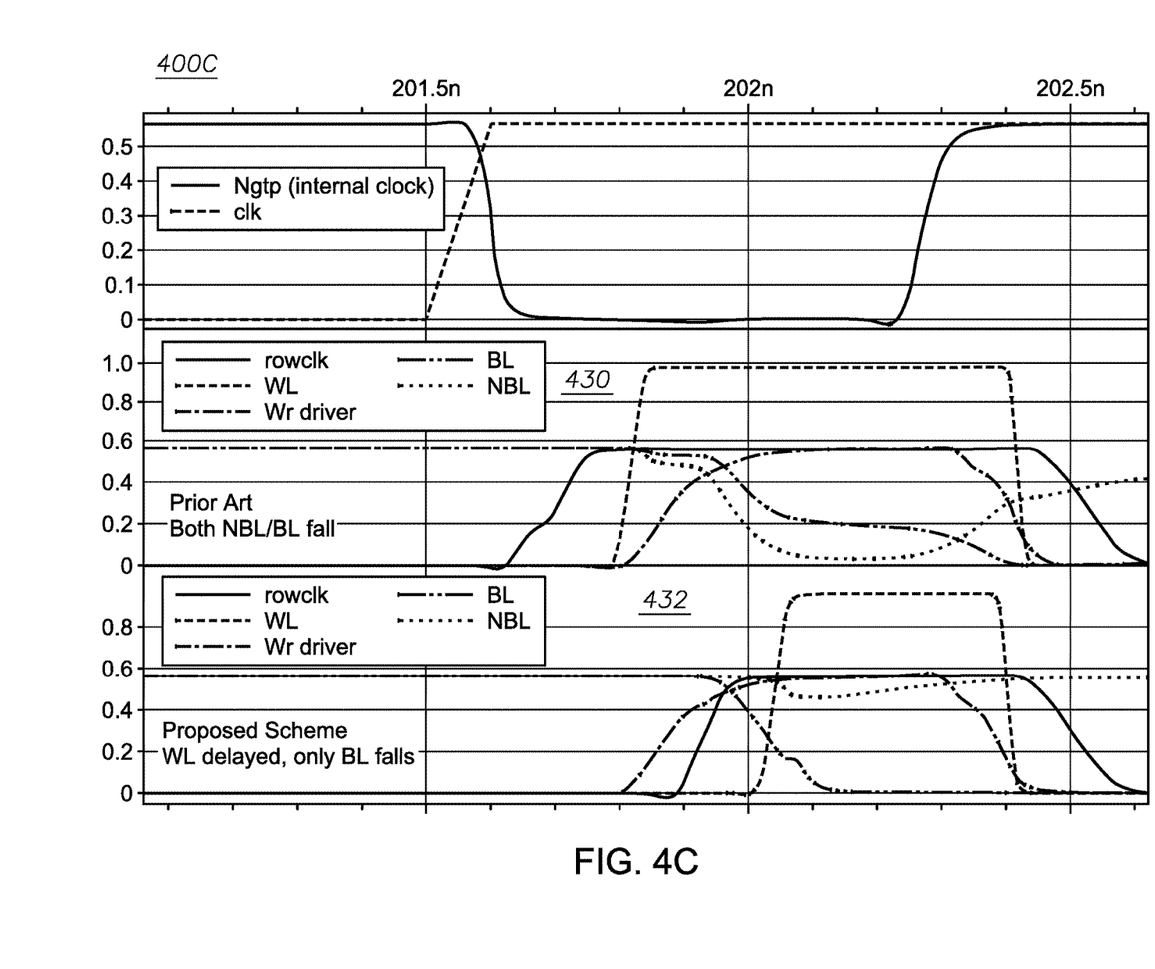

FIGS. 4A-4C illustrate various signal timing diagrams in accordance with various implementations described herein. In particular, FIG. 4A illustrates an operation diagram 400A of the VDS circuitry 300 when VDDC=VDDP+ΔV, FIG. 4B illustrates a voltage sensing operation 400B for different combinations of VDDC and VDDP, and FIG. 4C illustrates various waveforms 400C depicting a write cycle in prior and disclosed designs. In this instance, FIG. 4C shows a prior art waveform 430, wherein both bitlines NBL/BL fall, and FIG. 4C shows a proposed scheme waveform 432 in accordance with techniques described herein, wherein only the bitline BL falls.

In reference to FIGS. 1 and 4A-4C, the core and periphery circuitry 102, 112 may operate with different power supplies VDDC, VDDP at different voltages. The Row Decoder 108 and Core 104 operate at VDDC supply domain while the Write Driver Control 120 and Column Decoder and I/Os 114, 116 operate at VDDP supply domain. FIG. 3A shows the voltage differential sensing (VDS) circuitry 300 that resides in the Write Driver Control 120. The capacitors C1-C2-C3-C4 shown in FIG. 3A are configurable and may be configured to introduce delay only when VDDC−VDDP>=Δ (delta), where Δ (delta) is a voltage threshold Vth defined as the voltage differential ΔV at which the bitline falls to 50% of VDDP due to false read (or write failure) in a write cycle.

This design may be optimized for VDDC=VDDP with margins related to write driver clock to arrive before wordline arrival. When VDDC is greater than VDDP by DELTA (Δ), during a write cycle to an opposite state, the wordline may become active before the WR Driver signal. In this instance, the memory cell 106 may be in read mode before the write occurs, resulting in a situation where one local bit line (NBL shown in FIG. 2) is pulled down to ground due to read while the other bitline (BL shown in FIG. 2) is pulled down on arrival of write signal leaving the memory cell 106 in an un-writeable state. This phenomenon is referred to as a FALSE READ (or WRITE FAILURE). In some cases, VDDC=VDDP+Δ, where Δ (delta) is a voltage threshold Vth defined as a voltage differential at which the bitline falls to 50% of VDDP due to false read (or write failure) in a write cycle. For instance, a write failure may occur when VDDC=VDDP+ΔV, when ΔV is much greater than (>>) a voltage threshold Vth, such as e.g., 100 mV.

Table 1 below is a tabulated circuit operation based on voltage levels of the core supply voltage VDDC and the periphery supply voltage VDDP.

TABLE 1

| VOLTAGE LEVELS | WRITE CYCLE | READ CYCLE |
| --- | --- | --- |
| VDDC < VDDP | NO DELAY | NO DELAY |
| VDDC > VDDP + (100 mV) | NO DELAY | NO DELAY |
| VDDC >> VDDP + (>100 mV) | DELAY INTRODUCED IN WL GENERATION | NO DELAY |

Figure 5:
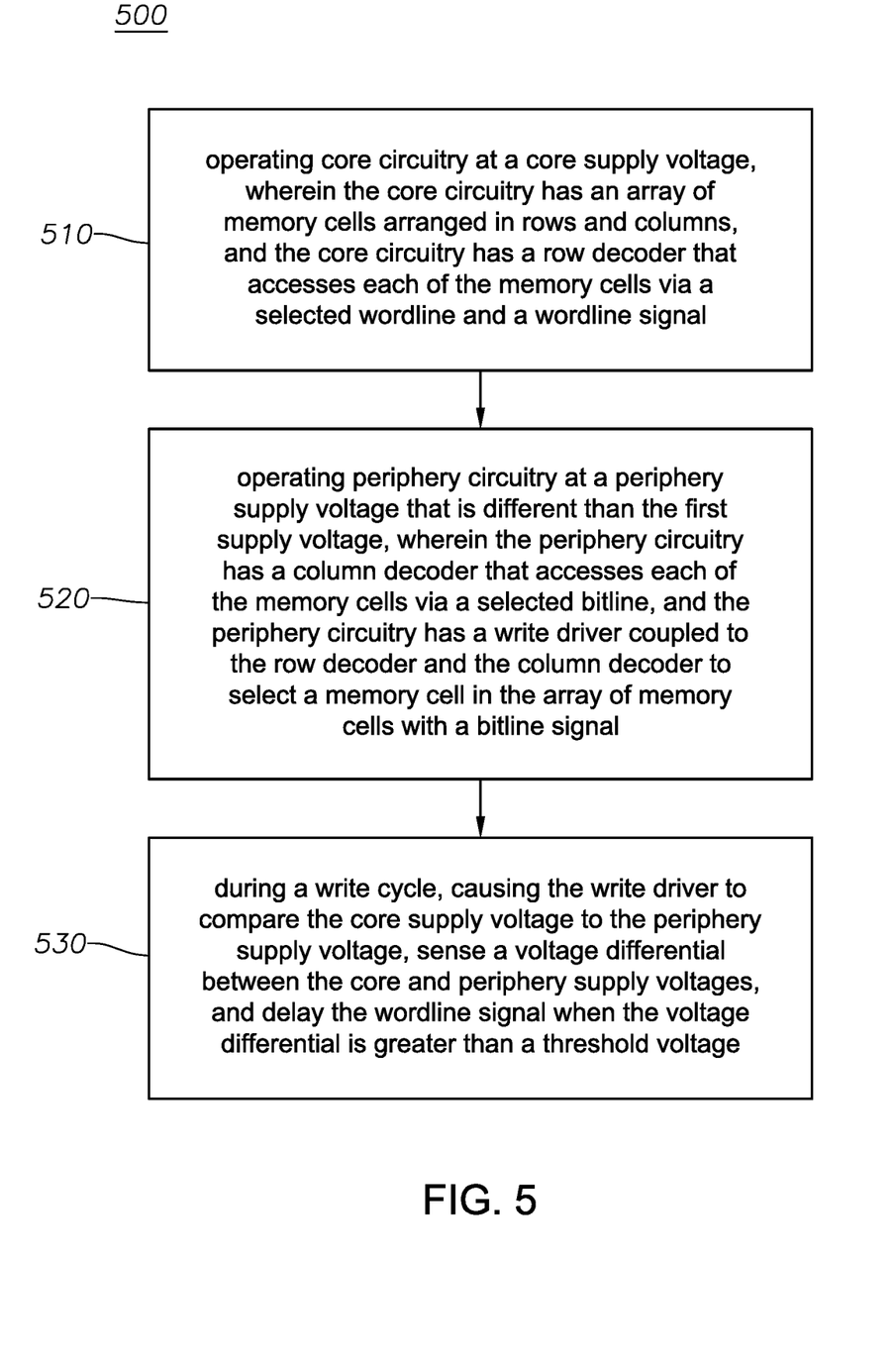
FIG. 5 illustrates a process flow of a method of sensing a voltage differential in accordance with various implementations described herein.

FIG. 5 illustrates a method 500 of sensing a voltage differential in accordance with various implementations described herein.

It should be understood that even though method 500 may indicate a particular order of operation execution, in some cases, various certain portions of the operations may be executed in a different order, and on different systems. In some other cases, additional operations and/or steps may be added to and/or omitted from method 500. Further, method 500 may be implemented in hardware and/or software. If implemented in hardware, the method 500 may be implemented with various circuit components, such as described herein above in reference to FIGS. 1-4. If implemented in software, the method 500 may be implemented as a program or software instruction process that may be configured to sense voltage differentials as described herein. Further, if implemented in software, instructions related to implementing the method 500 may be stored in memory and/or a database. For instance, a computer or various other types of computing devices having a processor and memory may be configured to perform method 500.

In reference to FIG. 5, method 500 may be utilized in voltage aware circuitry for sensing voltage differential in memory applications. In some implementations, at block 510, method 500 may operate core circuitry at a core supply voltage. Further, at block 510, the core circuitry may include an array of memory cells (or bitcells) arranged in rows and columns, and the core circuitry may have a row decoder that accesses each of the memory cells (or bitcells) via a selected wordline and a wordline signal.

At block 520, method 500 may operate periphery circuitry at a periphery supply voltage that is different than the core supply voltage. Further, at block 520, the periphery circuitry may have a column decoder that accesses each of the memory cells (or bitcells) via a selected bitline, and the periphery circuitry may have a write driver coupled to the row decoder and the column decoder to select a memory cell (or bitcell) in the array of memory cells (or bitcells) with a bitline signal.

At block 530, during a write cycle, method 500 may cause voltage differential sensing circuitry to compare the core supply voltage to the periphery supply voltage and sense a voltage differential between the core and periphery supply voltages. Further, at block 520, method 500 may delay the wordline signal when the voltage differential is greater than a threshold voltage. In some implementations, as described herein, the threshold voltage may be 100 mV. Further, in some implementations, during the write cycle, method 500 may cause the write driver to write data to the selected memory cell via the selected wordline and the selected bitline.

Described herein are various implementations of an integrated circuit. The integrated circuit may include core circuitry having an array of memory cells arranged in rows and columns. The core circuitry may include a row decoder that accesses each of the memory cells via a selected wordline and a wordline signal. The core circuitry may operate at a first supply voltage. The integrated circuit may include periphery circuitry having a column decoder that accesses each of the memory cells via a selected bitline. The periphery circuitry may include a write driver coupled to the column decoder to select a memory cell in the array of memory cells with a bitline signal. The periphery circuitry may include voltage differential sensing circuitry. The periphery circuitry may operate at a second supply voltage that is different than the first supply voltage. The write driver may write data to the selected memory cell via the selected wordline and the selected bitline. During a write cycle, the voltage differential sensing circuitry may compare the first supply voltage to the second supply voltage, sense a voltage differential between the first and second supply voltages, and delay the wordline signal when the voltage differential is greater than a threshold voltage.

Described herein are various implementations of an integrated circuit. The integrated circuit may include an array of memory cells, rowclk generation circuitry, and voltage differential sensing circuitry. The rowclk generation circuitry may generate a wordline signal to select a memory cell in the array of memory cells during a write cycle. The voltage differential sensing circuitry may include a sense amplifier having a first node and a second node that is different than the first node. The first node may be interposed between a first pair of complementary transistors. The first node may be coupled to each gate of a second pair of complementary transistors. The second node may be interposed between the second pair of complementary transistors. The second node may be coupled to each gate of the first pair of complementary transistors. The voltage differential sensing circuitry may include a first capacitor coupled to the second node. The first capacitor may couple charge on the second node when a core enable signal rises from a logic zero state to a logic one state. The voltage differential sensing circuitry may include a pair of capacitors coupled to the first node. The pair of capacitors may couple charge on the first node when a periphery enable signal rises from a logic zero state to a logic one state. The voltage differential sensing circuitry may include an enable circuit that receives a delay select signal and provides the core enable signal to the first capacitor and the periphery enable signal to each of the pair of capacitors. The core enable signal may be based on a core supply voltage, and the periphery enable signal may be based on a periphery supply voltage. When a voltage differential between the periphery supply voltage and the core supply voltage is greater than a voltage threshold, then the pair of capacitors may couple different voltages on the first and second nodes, generating another voltage differential to resolve the first node to logic zero and the second node to logic one. The rowclk generation circuitry may sense the logic zero state of the first node, sense the logic one state of the second node, and delay the wordline signal when the voltage differential is greater than the threshold voltage.

Described herein are various implementations of a method. The method may include operating core circuitry at a core supply voltage. The core circuitry may include an array of memory cells arranged in rows and columns. The core circuitry may include a row decoder that accesses each of the memory cells via a selected wordline. The method may include operating periphery circuitry at a periphery supply voltage that is different than the core supply voltage. The periphery circuitry may include a column decoder that accesses each of the memory cells via a selected bitline. The periphery circuitry may include a write driver coupled to the the column decoder to select a memory cell in the array of memory cells with a a bitline signal. During a write cycle, the method may cause rowclk generation circuitry to compare the core supply voltage to the periphery supply voltage, sense a voltage differential between the core and periphery supply voltages, and delay the wordline signal when the voltage differential is greater than a threshold voltage.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   core circuitry having an array of memory cells arranged in rows and columns, the core circuitry having a row decoder that accesses each of the memory cells via a selected wordline and a wordline signal, the core circuitry operating at a first supply voltage; and
   periphery circuitry having a column decoder that accesses each of the memory cells via a selected bitline, the periphery circuitry having a write driver coupled to the column decoder to select a memory cell in the array of memory cells with a bitline signal, the periphery circuitry having voltage differential sensing circuitry, and the periphery circuitry operating at a second supply voltage that is different than the first supply voltage,
   wherein the write driver writes data to the selected memory cell via the selected wordline and the selected bitline, and during a write cycle, the voltage differential sensing circuitry compares the first supply voltage to the second supply voltage, senses a voltage differential between the first and second supply voltages, and delays the wordline signal when the voltage differential is greater than a threshold voltage.

2. The integrated circuit of claim 1, wherein the integrated circuit comprises a dual rail memory architecture.

3. The integrated circuit of claim 1, wherein the selected bitline comprises a selected pair of complementary bitlines.

4. The integrated circuit of claim 1, wherein the first supply voltage comprises a core supply voltage, and wherein the second supply voltage comprises a periphery supply voltage that is different than the core supply voltage.

5. The integrated circuit of claim 1, wherein the row decoder operates at the first supply voltage, and wherein a wordline driver generates the wordline signal at the first supply voltage.

6. The integrated circuit of claim 1, wherein the column decoder operates at the second supply voltage, and wherein the write driver generates a bitline select signal at the second supply voltage.

7. The integrated circuit of claim 1, wherein the voltage differential sensing circuitry is coupled to rowclk generation circuitry and delays the wordline signal only during the write cycle.

8. The integrated circuit of claim 1, wherein the voltage differential sensing circuitry is coupled to rowclk generation circuitry and delays the wordline signal only when the voltage differential is greater than the threshold voltage.

9. The integrated circuit of claim 1, wherein the threshold voltage is approximate to a voltage level that causes a write failure.

10. The integrated circuit of claim 1, wherein the voltage differential sensing circuitry comprises a sense amplifier and multiple capacitors that add capacitances to introduce imbalance based on the core and periphery supply voltages.

11. The integrated circuit of claim 1, wherein ratios of the capacitances determine a value of the voltage threshold that causes a wordline driver to delay the wordline signal when the voltage differential is greater than the threshold voltage.

12. A method, comprising:
operating core circuitry at a core supply voltage, wherein the core circuitry has an array of memory cells arranged in rows and columns, and the core circuitry has a row decoder that accesses each of the memory cells via a selected wordline and a wordline signal;
operating periphery circuitry at a periphery supply voltage that is different than the core supply voltage, wherein the periphery circuitry has a column decoder that accesses each of the memory cells via a selected bitline, and the periphery circuitry has a write driver coupled to the column decoder to select a memory cell in the array of memory cells with a bitline signal; and
during a write cycle, causing rowclk generation circuitry to compare the core supply voltage to the periphery supply voltage, sense a voltage differential between the core and periphery supply voltages, and delay the wordline signal when the voltage differential is greater than a threshold voltage.

13. The method of claim 12, further comprising:
during the write cycle, causing the write driver to write data to the selected memory cell via the selected wordline and the selected bitline.

14. The method of claim 12, wherein the threshold voltage is approximate to a voltage level that causes a write failure.

* * * * *